United States Patent
Bousquet

(10) Patent No.: US 10,455,127 B2
(45) Date of Patent: Oct. 22, 2019

(54) MOVEMENT DETECTION DEVICE

(71) Applicant: SAFRAN ELECTRONICS & DEFENSE SAS, Boulogne Billancourt (FR)

(72) Inventor: Marc Bousquet, Boulogne Billancourt (FR)

(73) Assignee: SAFRAN ELECTRONICS & DEFENSE SAS, Boulogne Billancourt (FR)

(*) Notice: Subject to any disclaimer, the term of this patent is extended or adjusted under 35 U.S.C. 154(b) by 255 days.

(21) Appl. No.: 15/324,901

(22) PCT Filed: Jul. 16, 2015

(86) PCT No.: PCT/EP2015/066226
§ 371 (c)(1),
(2) Date: Jan. 9, 2017

(87) PCT Pub. No.: WO2016/008959
PCT Pub. Date: Jan. 21, 2016

(65) Prior Publication Data
US 2017/0208222 A1    Jul. 20, 2017

(30) Foreign Application Priority Data

Jul. 18, 2014    (FR) .................................... 14 56957

(51) Int. Cl.
*H04N 5/225*    (2006.01)
*H04N 5/14*    (2006.01)
(Continued)

(52) U.S. Cl.
CPC ....... *H04N 5/145* (2013.01); *H01L 27/14623* (2013.01); *H01L 27/14643* (2013.01); *H04N 5/369* (2013.01)

(58) Field of Classification Search
CPC .... H04N 5/23287; H04N 5/45; G01N 21/645; G01N 15/0211; G06K 13/067
(Continued)

(56) References Cited

U.S. PATENT DOCUMENTS 5,007,737 A * 4/1991 Hirleman, Jr. ...... G01N 15/0211
356/335
5,289,262 A * 2/1994 McConnell .......... G06K 13/067
250/559.3
(Continued)

FOREIGN PATENT DOCUMENTS

DE    10 2010 027791 A1    10/2011

OTHER PUBLICATIONS

Sep. 24, 2015 Search Report issued in International Patent Application No. PCT/EP2015/066226.

*Primary Examiner* — Gims S Philippe
(74) *Attorney, Agent, or Firm* — Oliff PLC; R. Brian Drozd

(57) ABSTRACT

A movement detection device, including a multi-element photodiode, the multi-element photodiode comprising a plurality of pixels, referred to as megapixels, and, for at least one megapixel of the multi-element photodiode, a mask partially obscuring a sensitive zone of said megapixel, the mask consisting of a plurality of zones including at least one opaque zone and at least one transparent zone, an opaque zone being able to prevent a light beam from fully reaching portions of the sensitive zone of the megapixel corresponding to the opaque zone, a transparent zone being able to allow a light beam to reach a portion of the sensitive surface of the megapixel corresponding to the transparent zone, each opaque zone having at least one adjacent transparent zone so as to obtain an alternation of opaque zones and transparent zones in the mask.

16 Claims, 5 Drawing Sheets

(51) Int. Cl.
*H01L 27/146* (2006.01)
*H04N 5/369* (2011.01)

(58) Field of Classification Search
USPC .................. 422/50; 250/559.3; 356/335, 337
See application file for complete search history.

(56) References Cited

U.S. PATENT DOCUMENTS

| | | | |
|---|---|---|---|
| 6,177,994 B1 * | 1/2001 | Watson | G01N 15/0211 356/337 |
| 7,198,755 B2 * | 4/2007 | Tokhtuev | G01N 21/645 422/50 |
| 2002/0158294 A1 | 10/2002 | Fujiwara et al. | |
| 2012/0188425 A1 | 7/2012 | Kita | |

* cited by examiner

MOVEMENT DETECTION DEVICE

The present invention relates to a movement detection device, an optronic system comprising said device and a method for processing high-frequency movements taking into account use of said device.

Figure 1A:
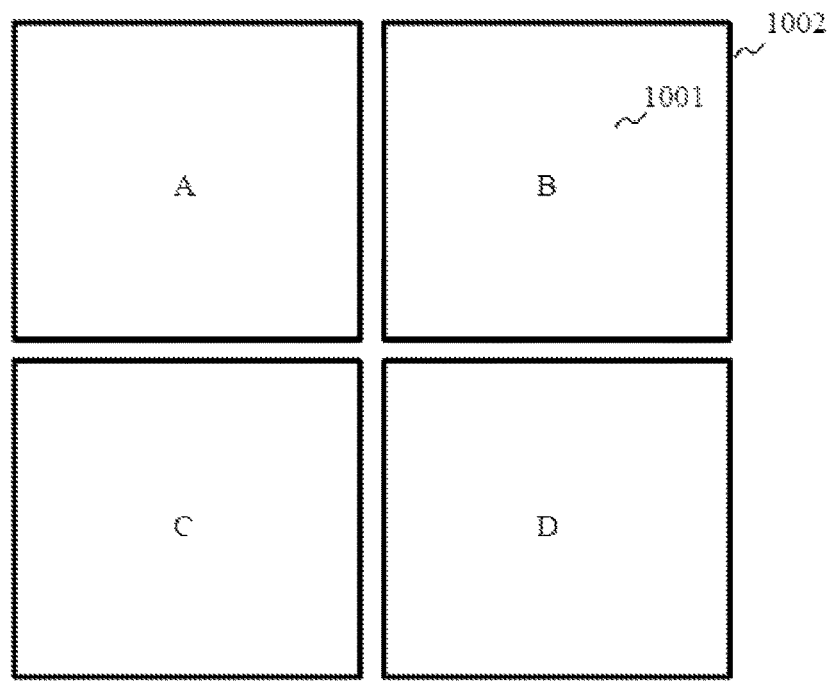
Figure 1B:
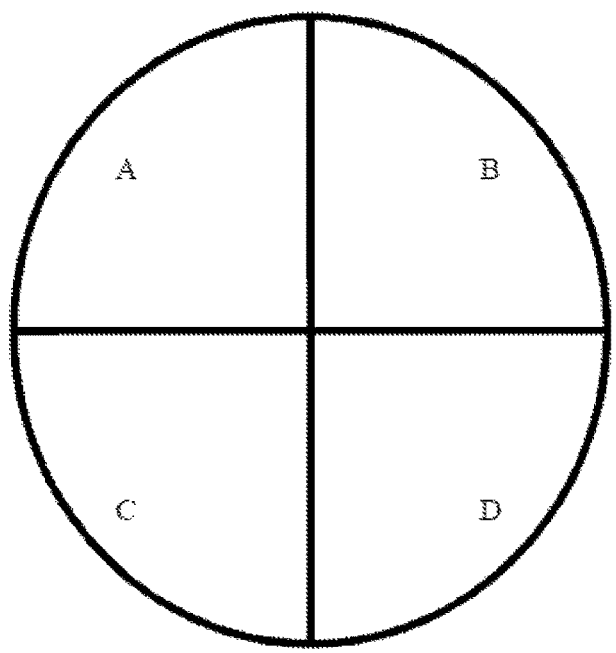

Multi-element photodiodes (which will be referred to hereinafter as "ME photodiodes") are devices frequently used for making adjustments in laser readers such as CD or DVD readers and in satellites for controlling laser sighting lines. An ME photodiode is in general square in shape as shown schematically in FIG. 1A, or circular as shown in FIG. 1B.

An ME photodiode in general comprises from two to eight quadrants separated by spaces. FIGS. 1A and 1B show ME photodiodes comprising four quadrants denoted A, B, C and D. Each quadrant comprises a sensor that is referred to hereinafter as a megapixel sensor. A megapixel comprises a zone, referred to as a "sensitive zone", sensitive to incident light (for example the zone 1001 of quadrant B in the ME photodiode shown in FIG. 1A) delimited by a boundary (for example the boundary 1002 of quadrant B in the ME photodiode shown in FIG. 1A). Important parameters characterising a megapixel are the surface of the sensitive zone and the length of the boundary (or perimeter) delimiting the sensitive zone. Each megapixel produces an electrical signal when it is touched by a light beam. The signals produced respectively by the megapixels of the quadrants A, B, C and D are denoted $S_A$, $S_B$, $S_C$ and $S_D$. Moreover, an ME photodiode produces two signals $\Delta X$ and $\Delta Y$. The signals $\Delta X$ and $\Delta Y$ represent a movement in a scene corresponding to the light beam received by the ME photodiode.

The values of the signals $\Delta X$ and $\Delta Y$ are linked to the values of the signal $S_A$, $S_B$, $S_C$ and $S_D$ by the following equations:

$$\Delta X = \frac{-S_A + S_B - S_C + S_D}{S_A + S_B + S_C + S_D};$$

$$\Delta Y = \frac{S_A + S_B - S_C - S_D}{S_A + S_B + S_C + S_D};$$

It is usual to use ME photodiodes in an optronic system enabling an object to be followed in a scene. The objects followed are in general objects of known forms, such as for example laser pointers generated by laser designators. As long as an object is centred on the ME photodiode, the ME photodiode produces null signals $\Delta X$ and $\Delta Y$. As soon as the object moves away from a centre (or from a barycentre) of the ME photodiode, at least one of signals $\Delta X$ and $\Delta Y$ becomes non-null, which subsequently makes it possible to readjust the optronic system on the targeted object.

The signals representing a movement $\Delta X$ and $\Delta Y$ are dependent mainly on brightness variations (or gradients) on the boundary of the sensitive zone of the megapixels. A sensitive zone having a long boundary length offers more chances of measuring a brightness gradient than a sensitive zone having a short boundary length. It is generally considered that the brightness gradient is proportional to the length of the boundary of the sensitive zone of the megapixel, whereas each signal $S_i$ (where i=A, B, C or D for an ME photodiode with four quadrants) is proportional to the surface of the sensitive zone of the corresponding megapixel.

Increasing the length of the boundary of the sensitive zones of the megapixels in an ME photodiode does not necessarily make it possible to improve the ME photodiode in terms of sensitivity to movements. This is because increasing the length of the boundary of a sensitive zone gives rise to an increase of the surface of the sensitive zone. Each signal $S_i$ integrates all the light beams received by the whole of the surface of the sensitive zone of the corresponding megapixel. Consequently, when the surface of the sensitive zone is large, the contribution of the brightness gradients perceived on the boundary of the sensitive zone in the signal $S_i$ risks being small compared with the contribution of all the light beams received over the whole of the surface of the sensitive zone. The signal $S_i$ then mainly represents an acquisition noise signal, which affects the signals $\Delta X$ and $\Delta Y$ in terms of ability to effectively represent movements.

The objective of the invention is to solve the problems mentioned above. The invention aims in particular to propose a movement detection device having sensitivity to movements that is improved compared with a conventional ME photodiode.

To this end, according to a first aspect of the present invention, the present invention relates to a movement detection device comprising a multi-element photodiode, the multi-element photodiode comprising a plurality of pixels, referred to as megapixels, and, for at least one megapixel of the multi-element photodiode, referred to as an obscured megapixel, a mask partially obscuring a sensitive zone of said obscured megapixel, the mask consisting of a plurality of zones comprising at least one opaque zone and at least one transparent zone, an opaque zone being able to prevent a light beam from fully reaching portions of the sensitive zone of the obscured megapixel corresponding to said opaque zone, a transparent zone being able to allow a light beam to reach a portion of the sensitive surface of the obscured megapixel corresponding to said transparent zone, each opaque zone having at least one adjacent transparent zone so as to obtain an alternation of opaque zones and transparent zones in the mask.

Adding a mask alternating opaque zones and transparent zones improves the sensitivity of the multi-element photodiode to movements.

According to one embodiment, when the multi-element photodiode comprises a plurality of obscured megapixels, the masks used for obscuring the sensitive zone of each obscured megapixel of the multi-element photodiode are identical.

The use of identical masks simplifies the production of the masks.

According to one embodiment, when the multi-element photodiode comprises a plurality of obscured megapixels, different masks are used for at least two obscured megapixels of the multi-element photodiode.

In this way, it is possible to control the sensitivity of certain obscured megapixels compared with others.

According to one embodiment, each mask is a chequered design comprising opaque zones and transparent zones of identical sizes.

According to one embodiment, each mask is an anisotropic mask favouring a brightness gradient orientation.

In this way, it is possible to favour certain movement directions.

According to one embodiment, each anisotropic mask consists of an alternation of opaque zones and transparent zones in the form of brightness perpendicular to a brightness gradient orientation to be favoured.

According to one embodiment, each mask is adaptive and the movement detection device comprises a control device adapting each mask according to changes in shape and size of an object the movement of which is to be detected.

In this way the movement detection is improved.

According to one embodiment, each mask is adaptive and the movement detection device comprises a control device able to adapt each mask according to a content of a scene in which a movement is to be detected, said scene corresponding to a light beam received by the movement detection device, the content of said scene being represented by contours of objects contained in said scene, zones of each mask corresponding to the contours being implemented by transparent zones and zones of each mask not corresponding to the contours being implemented by opaque zones.

The use of masks adapted to the contours of the objects makes it possible to improve the movement direction by focusing the movement detection on zones of the scene representing high gradients.

According to one embodiment, each mask is an adaptive anisotropic mask and the movement detection device comprises a control device able to adapt each mask according to at least one characteristic of a movement obtained by the control device.

In some scenes, only some types of movement are of interest. Adapting each mask to characteristics of the movement makes it possible to focus only on certain interesting movements.

According to one embodiment, the or at least one of said characteristics of a movement represents a movement in a scene in which a movement is to be detected, the or at least one of said characteristics having been obtained by a movement estimation method, said scene corresponding to a light beam received by the movement detection device.

The use of a movement estimation method makes it possible to automate the adaptation of each mask.

According to one embodiment, the or at least one of said characteristics of a movement is a set of motion vectors of blocks of pixels of an image representing said scene, the adaptive anisotropic mask being divided into zones, each zone corresponding to one of said blocks of pixels, the adaptive anisotropic mask being adapted in each zone so that each zone consists of an alternation of opaque zones and transparent zones in the form of bands perpendicular to the direction of the motion vector of the block of pixels corresponding to the zone.

Adapting the anisotropic mask by zone makes it possible to better detect local movements in the images representing the scene.

According to one embodiment, for a megapixel of the multi-element photodiode, the mask is produced on the sensitive zone of the megapixel, or in the form of an optical plate bonded to the sensitive zone of the megapixel, or in the form of an optical plate which, when it is subjected to a light beam, projects an image of the mask onto the sensitive zone of the megapixel.

According to one embodiment, the adaptive mask is implemented by a programmable optical transmission element or by a programmable reflective element.

The use of a programmable optical transmission element or of a programmable reflective element makes it possible to produce adaptive masks.

According to a second aspect of the present invention, the present invention relates to an optronic system comprising an image sensor functioning with a first signal acquisition frequency, each image obtained by the image sensor representing a scene and a movement compensation device, the optronic system comprising a movement detection device according to the first aspect of the invention generating signal values representing movements of said scene with a second signal acquisition frequency higher than the first signal acquisition frequency, and a processing device able to control the movement compensation device according to said signal values representing movements.

Use of the movement detection device according to the first aspect of the invention makes it possible to ensure precise control of the movement compensation device.

According to a third aspect of the present invention, the present invention relates to a method for processing high-frequency movements in an optronic system comprising an image sensor functioning with a first signal acquisition frequency, each image obtained by the image sensor representing a scene, the method comprising steps of obtaining signal values representing a movement of said scene from a movement detection device according to the first aspect of the invention generating signal values representing movements that can affect the acquisition of images by the image sensor with a second signal acquisition frequency, higher than the first signal acquisition frequency, of determining values representing a movement of an image in the course of acquisition by the image sensor from said signal values representing a movement of said scene, said determination comprising a matrix operation between said signal values representing a movement of said scene and a conversion matrix, the conversion matrix being obtained by an obtaining method comprising a simulation of signals representing movements obtained by the movement detection device, the obtaining method taking into account characteristics of the movement detection device, and of transmission of the values representing a movement of the image in the course of acquisition by the image sensor thus determined to a movement compensation device so that said movement compensation device can implement a feedback in the optronic system in order to compensate the movement of the image in the course of acquisition by the image sensor.

Use of the movement detection device according to the first aspect of the invention makes it possible to ensure precise compensation of the movement of the image in the course of acquisition by the image sensor.

According to a fourth aspect of the present invention, the present invention relates to a computer program product containing instructions for the implementation, by a device, of the method according to the third aspect of the invention, when said program is executed by a processor of said device.

According to a fifth aspect of the present invention, the present invention relates to storage means storing a computer program containing instructions for the implementation, by a device, of the method according to the third aspect of the invention when said program is executed by a processor of said device.

Figure 2:
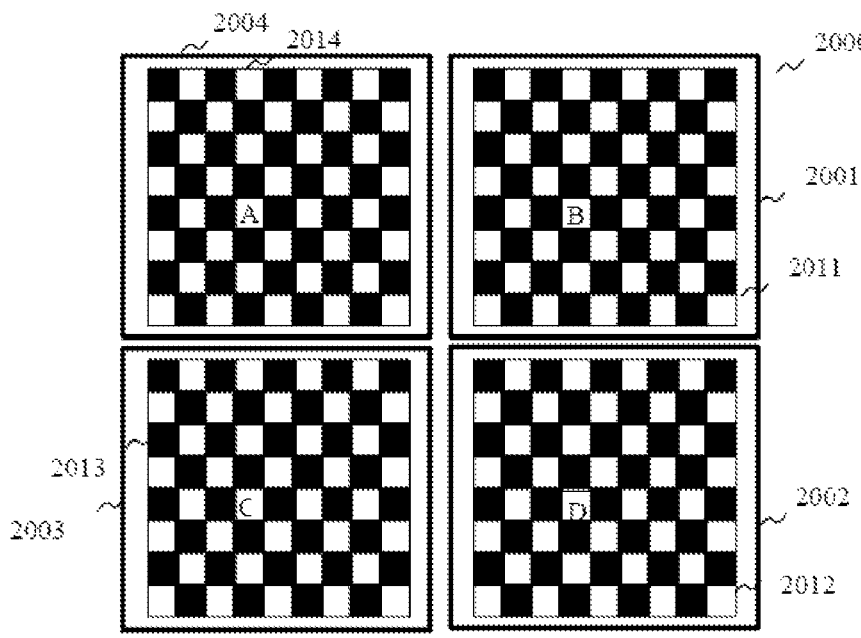
Figure 3:
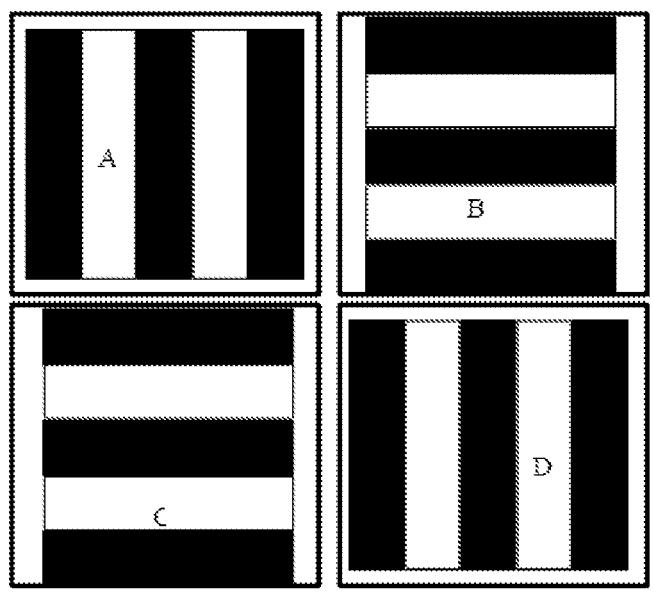
Figure 4:
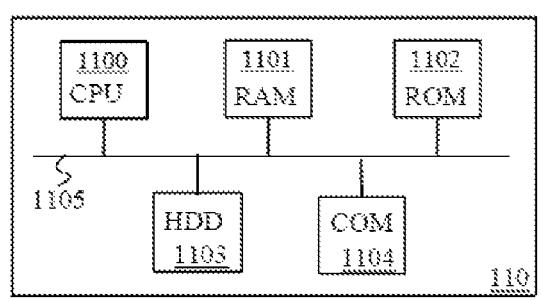
Figure 5:
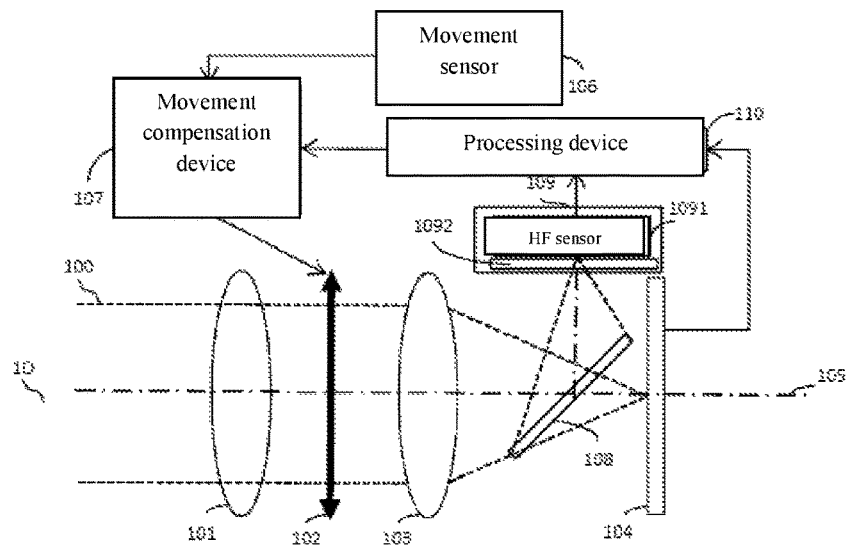
Figure 6:
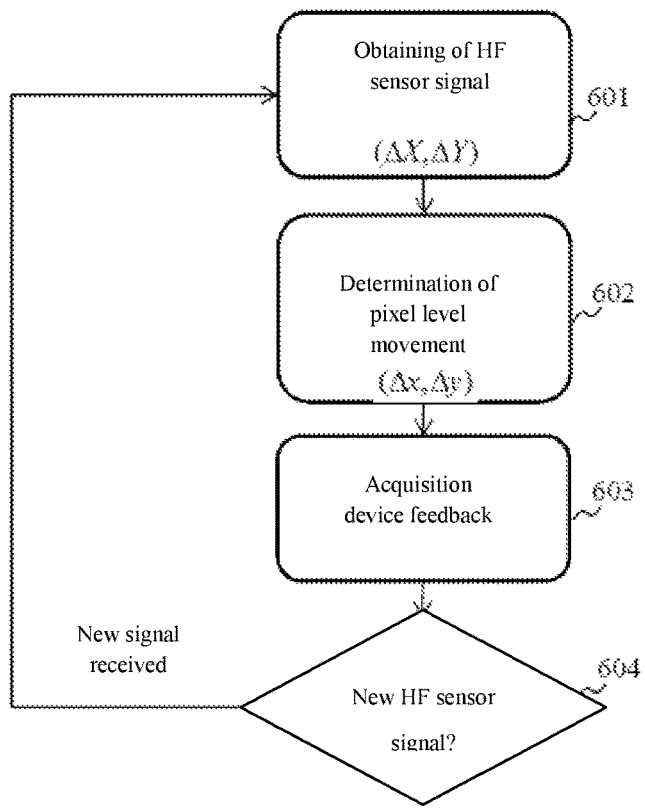
Figure 7:
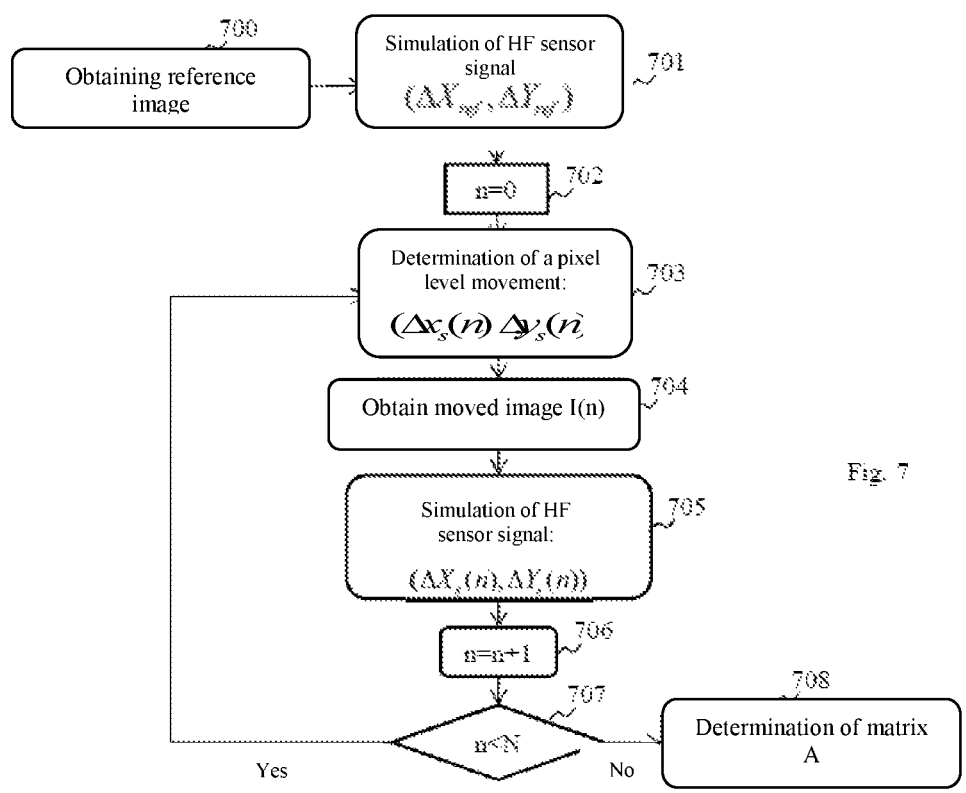
Figure 8:
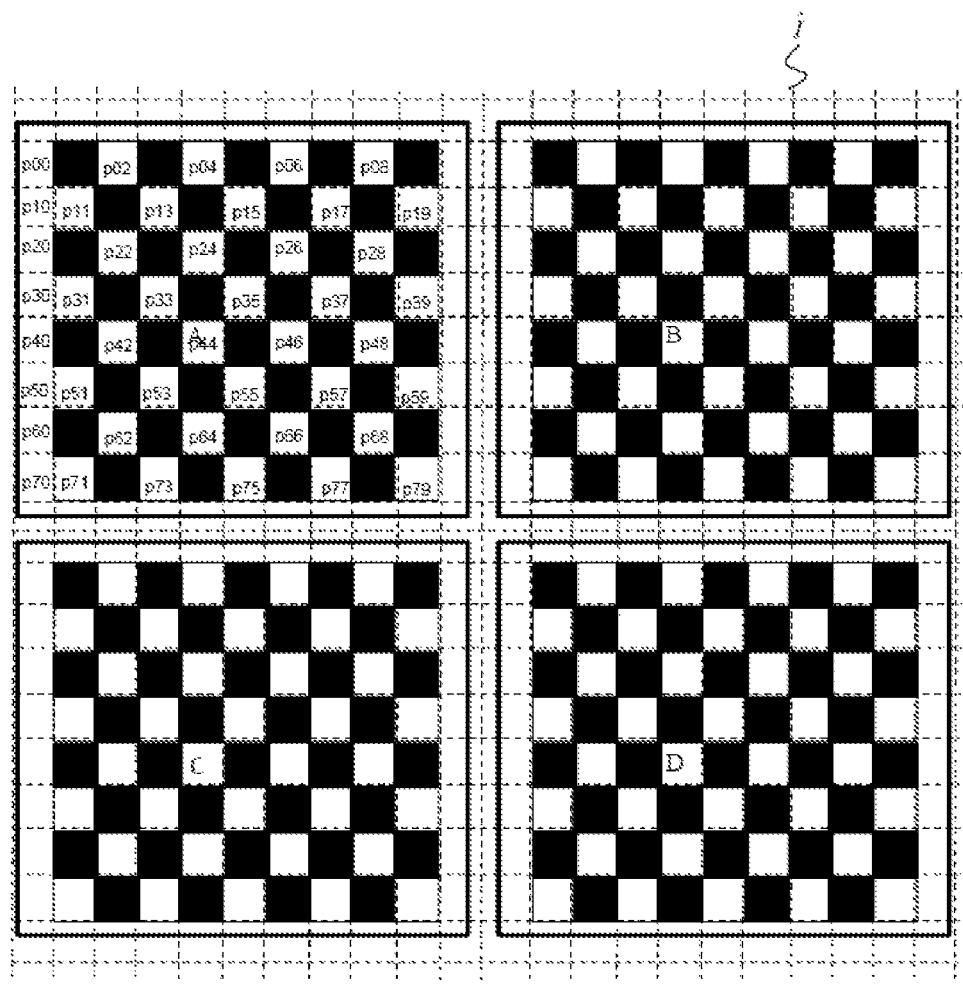

The features of the invention mentioned above, as well as others, will emerge more clearly from a reading of the following description of an example embodiment, said description being given in relation to the accompanying drawings, among which:

FIG. 1A depicts schematically an example of a multi-element photodiode comprising four square quadrants, FIG. 1B depicts schematically an example of a multi-element photodiode comprising four quadrants in the form of disc sectors, FIG. 2 illustrates schematically a first example of a movement detection device according to the invention, FIG. 3 illustrates schematically a second example of a movement detection device according to the invention, FIG. 4 illustrates schematically an example of hardware architecture of a processing device able to process the high-frequency movements of an optronic system, FIG. 5 depicts schematically an optronic system comprising the processing device able to process high-frequency movements of an optronic system, FIG. 6 depicts schematically an example of a method for processing high-frequency movements of an optronic system implemented by the processing device, FIG. 7 depicts schematically an example of a method for determining a conversion matrix used in the high-frequency movement processing method, FIG. 8 illustrates a matching of pixels of an image with megapixels of a multi-element photodiode, the matching being used in the high-frequency movement processing method and taking into account use of a movement detection device according to the invention.

As mentioned above, the sensitivity of an ME photodiode to movements depends essentially on the abilities of the ME photodiode to capture brightness gradients. In a conventional ME photodiode, the brightness gradients appear at the boundaries of the sensitive zone of each megapixel. We have seen however that an intuitive solution consisting of increasing the length of the boundary of the sensitive zones was not satisfactory. This is because this solution increases the risk of obtaining from the ME photodiode signals corresponding essentially to an acquisition noise.

FIG. 2 depicts schematically a first example of a movement detection device according to the invention. This device comprises an ME photodiode 2000 comprising a plurality of megapixels 2001, 2002, 2003 and 2004 and, for each megapixel, referred to as an obscured megapixel, a mask 2011, 2012, 2013, 2014 able to partially obscure a light beam received by the sensitive zone of the megapixel. For a given megapixel, the mask used consists of a plurality of zones. Certain zones in the plurality of zones, which will be referred to as "opaque zones", prevent a light beam from reaching portions of the sensitive zone of the megapixel corresponding to the opaque zones and generally situated below said opaque zones. Other zones, which will be referred to as "transparent zones", allow the light beam to reach portions of the sensitive zone of the megapixel corresponding to the transparent zones and generally situated below said transparent zones.

In a mask, each opaque zone has at least one adjacent transparent zone so as to obtain an alternation of opaque zones and transparent zones in the mask. The use of such masks makes it possible to obtain, on the sensitive zone of each megapixel of the ME photodiode, an alternation of zones receiving a light beam, referred to as "illuminated zones", and zones not receiving a light beam, referred to as "blind zones".

When a megapixel comprising such a mask is subjected to a light beam, each boundary between an illuminated zone and a blind zone is able to capture a brightness gradient. By increasing the number of boundaries, the ability of the megapixel to capture brightness gradients is increased. It is also noted that increasing the number of boundaries by using such a mask does not result in an increase in the surface area of the sensitive zone of the megapixel, which avoids an increase in the proportion of the acquisition noise in the signals ΔX and ΔY produced by the ME photodiode. The use of such masks therefore makes it possible to obtain a movement detection device having sensitivity to movements that is improved compared with a conventional photodiode.

In the example in FIG. 2, the same mask partially obscures the sensitive zone of each megapixel. The mask used is a chequered pattern regularly alternating opaque zones and transparent zones of identical sizes.

In one embodiment, each mask is produced directly on the sensitive zone of the megapixels.

FIG. 3 depicts schematically a second example of a movement detection device according to the invention. In this embodiment, anisotropic masks are used. An anisotropic mask makes it possible to favour certain brightness gradient orientations. The opaque zones and the transparent zones of an anisotropic mask are bands that may be vertical, horizontal or oblique depending on the orientation of a brightness gradient that it is wished to favour.

In the example in FIG. 3, at least two megapixels comprise different masks. The anisotropic masks partially obscuring the sensitive zone of the megapixels A and D consist of vertical bands favouring detection of horizontal brightness gradients and therefore detection of horizontal movements. The anisotropic masks partially obscuring the megapixels B and C consist of horizontal bands favouring detection of vertical brightness gradients and therefore detection of vertical movements.

In one embodiment, each mask is produced in the form of an optical plate bonded to the sensitive zone of each megapixel.

In one embodiment, each mask is produced in the form of an optical plate which, when it is subjected to a light beam, projects an image of a mask onto the sensitive zone of each megapixel.

In one embodiment, the opaque zones are able to attenuate a light intensity of a light beam, without blocking it fully. Sufficient attenuation is then chosen so that the brightness gradients at the boundary of illuminated zones and blind zones are detectable by the megapixels.

In one embodiment, at least one megapixel of an ME photodiode comprising a plurality of megapixels is associated with a mask.

In a particular embodiment, a movement detection device according to the invention is used in an optronic system for detecting high-frequency movements.

FIG. 5 depicts schematically an optronic system 10, such as for example a photographic apparatus, consisting of an optical element comprising for example two groups of lenses, such as the groups of lenses 101 and 103, a movable element 102 generally implemented by a floating lens, an image sensor 104 such as a CCD (charge-couple device) or CMOS (complementary metal-oxide semiconductor) sensor. The groups of lenses 101 and 103, the movable element 102 and the image sensor 104 are perpendicular to an optical axis 105. The groups of lenses 101 and 103 and the movable element 102 make a light beam 100 converge towards the image sensor 104. A movement sensor 106, implemented for example by a gyrometer, determines low- and medium-frequency movements of the optronic system and transmits this information to a movement compensation device 107 modifying the position of the movable element 102 so as to compensate the movements of the optronic system 10. The movement compensation device 107 is implemented for example by motors or by electromagnets. The image sensor 104 produces images from the light beam 100 received. The images are produced at a signal acquisition frequency (or image acquisition frequency) of around a few tens of hertz and are transmitted in the direction of a display or a memory.

The optronic system 10 also comprises a device 108 for redirecting part of the light beam 100 towards a movement detection device 109 according to the invention. In the optronic system 10, the movement detection device 109 serves as a high-frequency movement sensor. The device 108 may for example be a semi-reflective device. The movement detection device 109 comprises an ME photodiode 1091 and a set of masks 1092 placed in front of the ME photodiode 1091. The set of masks 1092 comprises a plurality of masks, each megapixel of the ME photodiode 1091 being associated with one of the masks in the set of masks 1092. The movement detection device 109 is able to provide values representing a movement with a signal acquisition frequency of around a few kHz corresponding to the signal acquisition frequency of the ME photodiode 1091.

In the optronic system 10, the light beam 100 is transmitted simultaneously in the direction of the image sensor 104 and in the direction of the movement detection device 109, each sensor receiving part of the light beam 100. In this way, high-frequency movements that may affect the acquisition of images by the image sensor 104 are detected and values representing these movements can be measured by the movement detection device 109 with a signal acquisition frequency of around a few kHz.

In the optronic system 10, the values representing the movement are transmitted to a processing device 110 determining movement values that can be used by the movement compensation device 107. These movement values that can be used by the movement compensation device 107 represent movements in the images acquired by the image sensor 104 and are measured in numbers of pixels. These movements are referred to hereinafter as "pixel level movements". There exists a direct relationship between the pixel level movements and the movements of the optronic system. The movements of the optronic system considered here are angular movements. An optical system has a focal distance $f$ known by design. The focal distance $f$ is a parameter making it possible to make the link between a pixel level movement and the angular movement.

The values representing the pixel level movements determined by the processing device 110 can therefore be used directly by the movement compensation device 107 in order to compensate the movements of the optronic system. In this way, the processing device 110 controls a movement compensation device 107 on the basis of the values of the movement-representing signals $\Delta X$ and $\Delta Y$ produced by the photodiode 1091 of the movement detection device 109.

When the values representing the pixel level movements are expressed in the form of a horizontal movement value $\Delta x$ and a vertical movement value $\Delta y$, there exists a relationship between the signals $\Delta X$ and $\Delta Y$ produced by the ME photodiode 1091 and the values representing the pixel level movements:

$$\begin{pmatrix} \Delta X \\ \Delta Y \end{pmatrix} = M \cdot \begin{pmatrix} \Delta x \\ \Delta y \end{pmatrix}$$

where M is a 2×2 square conversion matrix dependent on a content of a scene aimed at by the optronic system.

When the values representing pixel level movements are determined by the processing device 110, they are transmitted to the movement compensation device 107 so that it can compensate these pixel level movements. The transmission frequency of the values representing the pixel level movements to the movement compensation device 107 may for example be equal to the signal acquisition frequency of the ME photodiode 1091. In this way, the movement compensation device 107 can compensate the high-frequency movements.

FIG. 6 depicts schematically an example of a method for processing high-frequency movements of the optronic system 10 implemented by the processing device 110. This method comprises the obtaining by the processing device 110 of signal values representing movements on the part of the ME photodiode 1091 of the movement detection device 109. As seen above, a pixel level movement represents a movement of the optronic system. In a step 601, the processing device 110 obtains values of the signals $\Delta X$ and $\Delta Y$ of the ME photodiode 1091.

During a step 602, the processing device 110 determines the values representing the pixel level movements in the following manner:

$$\begin{pmatrix} \Delta x \\ \Delta y \end{pmatrix} = M^{-1} \cdot \begin{pmatrix} \Delta X \\ \Delta Y \end{pmatrix}$$

where $M^{-1}$ is the inverse of the conversion matrix M.

The conversion matrix M is assumed to be known to the processing device 110 during step 602. Hereinafter, in relation to FIG. 7, a method for determining the conversion matrix M implemented periodically by the processing device 110 is described.

In a step 603, the processing device 110 transmits the values representing the pixel level movements thus calculated to the movement compensation device 107 so that it can perform a feedback in the optronic system in order to compensate the pixel level movement calculated. In this embodiment, the transmission of the values representing pixel level movements follows the signal acquisition frequency of the ME photodiode 1091. The feedback can then be performed at the signal acquisition frequency of the photodiode. A high-frequency feedback is therefore obtained.

The processing device 110 next awaits reception of new signal values $\Delta X$ and $\Delta Y$ from the ME photodiode 1091 in a step 604. When new signal values $\Delta X$ and $\Delta Y$ are received, the processing device once again performs step 601.

The method for determining the values representing the pixel level movements described in relation to FIG. 6 requires knowledge of the conversion matrix M. The conversion matrix M changes over time and depends on the scene on which the movement detection device 109 is focused. It is then necessary to determine the conversion matrix M and to periodically update this matrix to take into account changes in the scene on which the optronic system 10 is focused.

FIG. 7 illustrates an example of a method for determining the conversion matrix M implemented periodically by the processing device 110. The method for determining the conversion matrix M takes into account characteristics of the movement detection device 109 and in particular the presence of the set of masks 1092 in front of the photodiode 1091. In one embodiment, the method for determining the conversion matrix M is implemented by the processing device 110 at the time of each acquisition of an image by the image sensor 104. An image acquired by the image sensor 104 is referred to as the "original image" hereinafter.

In a step 700, an original image acquired by the image sensor 104 is obtained by the processing device 110. In one embodiment, the processing device 110 uses this original image as the reference image during the determination of the conversion matrix M.

In a step 701, the processing device 110 simulates the signals $\Delta X_{ref}$ and $\Delta Y_{ref}$ that the ME photodiode 1091 would provide if it were subjected to a light beam corresponding to the reference image in accordance with a simulation method that is explained below.

In a step 702, a variable n is initialised to zero.

During steps 703 to 707, the processing device 110 applies movements of predetermined values to the reference image in order to obtain a set of moved images and, for each moved image, simulates the signals ΔX and ΔY that the ME photodiode 1091 would provide if it were subjected to a light beam corresponding to the moved image. These steps are detailed below.

During step 703, a pixel level movement of a predetermined value comprising a horizontal movement value $\Delta x_s(n)$ and a vertical movement value $\Delta y_s(n)$ is obtained by the processing device 110. This predetermined movement value is obtained for example from a list of predetermined movement values stored in a memory of the processing device 110.

In a step 704, a moved image I(n) is created by moving the pixels of the reference image by the value of the pixel movement ($\Delta x_s(n)$, $\Delta y_s(n)$).

In a step 705, the processing device implements a method for simulating the signal values $\Delta X_s(n)$ and $\Delta Y_s(n)$ that the ME photodiode would provide if it were subjected to a light beam corresponding to the moved image I(n). This simulation method is explained hereinafter. During this step the processing device 110 determines the values of the signals $S_A$, $S_B$, $S_C$ and $S_D$.

The values of the signals $\Delta X_s(n)$ and $\Delta Y_s(n)$ are next calculated as follows:

$$\Delta X_s(n) = \frac{-S_A + S_B - S_C + S_D}{S_A + S_B + S_C + S_D} - \Delta X_{ref};$$

$$\Delta Y_s(n) = \frac{S_A + S_B - S_C - S_D}{S_A + S_B + S_C + S_D} - \Delta Y_{ref};$$

During a step 706, the variable n is incremented by one unit. During a step 707, the variable n is compared with a constant N that will be explained subsequently. When the variable n is less than N, the processing device 110 creates a new moved image I(n) by returning to step 703. A predetermined pixel movement value different from any other predetermined pixel movement value already used for moved images I(n) created previously is then obtained by the processing device 110.

If the variable n is equal to the constant N, the step 707 is followed by a step 708, during which the conversion matrix M is determined.

The constant N fixes the number of images I(n) necessary for calculating the conversion matrix M. The conversion matrix M being a 2×2 matrix, it comprises four coefficients. The coefficients of the conversation matrix M form a set of four unknowns to be determined. For each moved image I(n), the following equation applies:

$$\begin{pmatrix} \Delta X_s(n) \\ \Delta Y_s(n) \end{pmatrix} = M \cdot \begin{pmatrix} \Delta x_s(n) \\ \Delta y_s(n) \end{pmatrix} = \begin{pmatrix} a_{11} & a_{21} \\ a_{12} & a_{22} \end{pmatrix} \cdot \begin{pmatrix} \Delta x_s(n) \\ \Delta y_s(n) \end{pmatrix}$$

where $a_{ij}$ represents coefficients of the matrix M. This equation therefore provides two equations for each image I(n). Knowing for each image I(n) the values of the signals $\Delta X_s(n)$ and $\Delta Y_s(n)$ and the corresponding pixel movement values ($\Delta x_s(n)$, $\Delta y_s(n)$), it is necessary and sufficient to have two images I(n) to be able to calculate the four coefficients $a_{ij}$ of the conversion matrix M. In theory, it therefore suffices to fix the constant N at the value two in order to determine the conversion matrix M. However, in order to avoid obtaining noisy coefficient values $a_{ij}$ of the conversion matrix M, it is preferable to fix the constant N at a value higher than two.

Then a system is obtained of 2N (N>2) equations with four unknowns that can be solved conventionally by a linear regression during step 708.

As soon as it is determined, the conversion matrix M is used by the processing device 110 during the pixel movement determination step 602.

As seen above, the method for determining the matrix M comprises, during steps 701 and 705, a method for simulating signal values $\Delta X_{ref}$ and $\Delta Y_{ref}$ and signals $\Delta X_s(n)$ and $\Delta Y_s(n)$ that the ME photodiode 1091 would provide if it were subjected to a light beam corresponding respectively to the reference image or to a moved image I(n). Let there be an image $\hat{I}$ that may be a reference image or a moved image I(n). During the implementation of the simulation method, the processing device 110 matches each megapixel of the ME photodiode with a set of pixels of the image $\hat{I}$ taking into account the presence of the set of masks 1092. For each megapixel, a sum of the values of the pixels of the image $\hat{I}$ that are not masked by the corresponding mask in the set of masks 1092 is calculated. The value of a signal $S_i$ (i∈{A, B,C,D}) is then equal to the sum of the values of the non-masked pixels of the image $\hat{I}$ calculated on the corresponding megapixel.

FIG. 8 shows an example of matching of pixels of an image $\hat{I}$ comprising four hundred and forty pixels with the four-quadrant photodiode shown schematically in FIG. 1A to which the set of masks shown schematically in FIG. 2 is applied. In this example, the value of the signal $S_A$ is calculated as a sum of the values of the pixels $p_{ij}$ (i∈[0,7], j∈[0,9]) corresponding to the quadrant A so that only the values of the pixels $p_{ij}$ for which the variable j=0 or the values of the pixels $p_{ij}$ for which the parity of the variable i is equal to the parity of the variable j (i.e. the variables i and j are both even or both odd) are added.

The masks described in relation to FIGS. 2 and 3 are assumed to be static. In one embodiment, each mask may be adaptive for example according to changes in shape and size of an object the movement of which it is wished to detect. For example, when the object is small, the sensitivity of an ME photodiode to the movements of such an object can be improved if the mask placed in front of each megapixel comprises a large number of opaque zones and transparent zones and these zones are small. The movements of a large object may on the other hand be detected effectively with a mask comprising a small number of opaque zones and transparent zones and large zones. This type of adaptive mask adapted to the size of an object may for example be used in the movement detection device 109 of the optronic system 10. In one embodiment, the size of an object the movement of which it is wished to follow is estimated by the processing device 110 from the images acquired by the image sensor 104. When compared with a previous image the size of the object increases, the processing device 110 sends adaptation parameters (or commands) to the movement detection device 109 so as to reduce the number of opaque zones and transparent zones and to increase the size of the zones in the masks in the set of masks 1092. When compared with a previous image the size of the object decreases, the processing device 110 sends adaptation parameters (or commands) to the movement detection device 109 so as to increase the number of opaque zones and transparent zones and to reduce the size of the zones in the masks in the set of masks 1092. The processing device 110 therefore serves as an automatic control device for all the adaptive masks 1092.

A finer adaptation of the masks in the set of masks 1092 to the content of an image corresponding to a light beam received by the movement detection device 109 can also be envisaged. The use of a mask makes it possible to artificially create gradients in the light beam captured by each megapixel of an ME photodiode. The light beam received by an ME photodiode corresponds to a scene. The detection of movements is facilitated when said scene itself comprises high gradients. The uniform zones of the scene are for their part difficult to use for movement detection and rather have a tendency to make the movement detection noisy. In a scene, the zones with high gradients correspond to contours of objects included in the scene. It is therefore possible to adapt the masks in the set of masks 1092 so as to transmit to the ME photodiode 1091 only portions of the light beam corresponding to the contours of the objects.

In one embodiment, a movement detection device 109 comprising a set of adaptive masks 1092, each mask being adapted to the content of the images received by the image sensor 104, is used in the optronic system 10. Each time an image is acquired by the image sensor 104, a detection of contours is implemented by the processing device 110 on the image captured by the image sensor 104. The detection of contours may for example be based on a high-pass filtering of the image captured by the sensor 104.

Subsequently, the masks in the set of masks 1092 are adapted to the contours detected, under the control of the processing device 110. For example, each mask will comprise transparent zones in zones corresponding to the contours detected and opaque zones in zones not corresponding to contours.

In one embodiment, the masks in the set of masks 1092 are adapted to at least one characteristic of a movement in the scene corresponding to the light signal received by the movement detection device 109. Adaptive anisotropic masks are used for favouring certain movement directions. In one implementation of this embodiment, the favoured movement directions can be determined by an operator using a control device for parameterising the masks in the set of masks. The operator determines a favoured movement direction for each mask. Each mask then consists of a succession of transparent and opaque bands perpendicular to the favoured movement direction.

In one embodiment, the favoured movement directions are determined automatically using a movement estimation method of the block matching type. Each time an image is acquired by the image sensor 104, the processing device 110 uses an estimation of movement between the last image acquired by the image sensor 104 and the image preceding it. The movement is estimated by blocks of pixels, taking for example blocks of size 32×32. Other larger or smaller block sizes could however be used. Following the movement estimation, each 32×32 block of the last image acquired by the image sensor 104 is associated with an item representing a movement such as a motion vector. Each mask in the set of masks 1092 is then divided into zones, each zone being associated with a 32×32 block of the last image acquired by the image sensor 104. In each zone, each mask in the set of masks 1092 consists of a succession of transparent bands and opaque bands perpendicular to the motion vector associated with the 32×32 block corresponding to the zone. The masks in the set of masks 1092 are here also adapted under the control of the processing device 110.

It should be noted that each adaptive mask in the set of masks 1092 can be implemented by placing, in front of each megapixel of the ME photodiode 1091, a locally programmable optical transmission element such as a liquid crystal screen. Alternatively, each mask in the set of masks 1092 can be implemented by a programmable reflective element such as a matrix of micro-mirrors of the DLP (digital light processing) type. The two programmable elements able to implement the masks in the set of masks 1092 may, as seen above, be parameterised by a control device manipulated by an operator or parameterised by the processing device 110 that transmits adaptation parameters (or commands) to the masks. The processing device 110 then serves as an automatic control device for the masks in the set of masks 1092.

FIG. 4 illustrates schematically an example of hardware architecture of the processing device 110. The processing device 110 comprises, connected by a communication bus 1105: a processor or CPU (central processing unit) 1100; a random access memory (RAM) 1101; a read only memory (ROM) 1102; a storage unit 1103 or a storage medium reader, such as an SD (secure digital) card reader or USB (universal serial bus) keys or a hard disk HDD (hard disk drive); at least one interface 1104 for exchanging data with other devices. The interface 1104 enables for example the processing device 110 to receive signal values ΔX and ΔY from the ME photodiode 1091 and images from the image sensor 104 and to transmit adaptation parameters to the masks in the set of masks 1092 when said masks are adaptive.

The processor 1100 is capable of executing instructions loaded in the RAM 1101 from the ROM 1102, from an external memory (not shown), from a storage medium or from a communication network. When the processing device 110 is powered up, the processor 1100 is capable of reading instructions from the RAM 1101 and executing them. These instructions form a computer program causing the implementation, by the processor 1100, of all or some of the algorithms and steps described in relation to the processing device 110 and FIGS. 6 and 7.

All or some of the algorithm steps described previously can thus be implemented in software form by the execution of a set of instructions by a programmable machine, such as a DSP (digital signal processor) or a microcontroller, or be implemented in hardware form by a machine or a dedicated component, such as an FPGA (field-programmable gate array) or an ASIC (application-specific integrated circuit).

The invention claimed is:

1. A movement detection device comprising:
a multi-element photodiode, the multi-element photodiode comprising a plurality of pixels, wherein each of the plurality of pixels is referred to as a megapixel, and for at least one megapixel of the multi-element photodiode, referred to as an obscured megapixel, a mask partially obscuring a sensitive zone of said obscured megapixel, the mask consisting of a plurality of zones comprising at least one opaque zone and at least one transparent zone, an opaque zone being able to prevent a light beam from fully reaching portions of the sensitive zone of the obscured megapixel corresponding to said opaque zone, a transparent zone being able to allow a light beam to reach a portion of the sensitive surface of the obscured megapixel corresponding to said transparent zone, each opaque zone having at least one adjacent transparent zone so as to obtain an alternation of opaque zones and transparent zones in the mask.

2. The movement detection device according to claim 1, wherein, when the multi-element photodiode comprises a plurality of obscured megapixels, the masks used for obscuring the sensitive zone of each obscured megapixel of the multi-element photodiode are identical.

3. The movement detection device according to claim 1, wherein, when the multi-element photodiode comprises a plurality of obscured megapixels, different masks are used for at least two obscured megapixels of the multi-element photodiode.

4. The movement detection device according to claim 1, wherein each mask is a chequerboard pattern comprising opaque zones and transparent zones of identical sizes.

5. The movement detection device according to claim 1, wherein each mask is an anisotropic mask favouring a brightness gradient orientation.

6. The movement detection device according to claim 5, wherein each anisotropic mask consists of an alternation of opaque zones and transparent zones in the form of bands perpendicular to a brightness gradient orientation to be favoured.

7. The movement detection device according to claim 1, wherein each mask is adaptive and the movement detection device further comprises a control device adapting each mask according to changes in shape and size of an object the movement of which is to be detected.

8. The movement detection device according to claim 1, wherein each mask is adaptive and the movement detection device further comprises a control device able to adapt each mask according to a content of a scene in which a movement is to be detected, said scene corresponding to a light beam received by the movement detection device, the content of said scene being represented by contours of objects contained in said scene, zones of each mask corresponding to the contours being implemented by transparent zones and zones of each mask not corresponding to the contours being implemented by opaque zones.

9. The movement detection device according to claim 1, wherein each mask is an adaptive anisotropic mask and the movement detection device further comprises a control device able to adapt each mask according to at least one characteristic of a movement obtained by the control device.

10. The movement detection device according to claim 9, wherein the at least one of said characteristics of a movement represents a movement in a scene in which a movement is to be detected, the or at least one of said characteristics having been obtained by a movement estimation method, said scene corresponding to a light beam received by the movement detection device.

11. The movement detection device according to claim 10, wherein the or at least one of said characteristics of a movement is a set of motion vectors of blocks of pixels of an image representing said scene, the adaptive anisotropic mask being divided into zones, each zone corresponding to one of said blocks of pixels, the adaptive anisotropic mask being adapted in each zone so that each zone consists of an alternation of opaque zones and transparent zones in the form of bands perpendicular to the direction of the motion vector of the block of pixels corresponding to the zone.

12. The movement detection device according to claim 1, wherein, for a megapixel of the multi-element photodiode, the mask is produced on the sensitive zone of the megapixel, or in the form of an optical plate bonded to the sensitive zone of the megapixel, or in the form of an optical plate which, when it is subjected to a light beam, projects an image of the mask onto the sensitive zone of the megapixel.

13. The movement detection device according to claim 7, wherein the adaptive mask is implemented by a programmable optical transmission element or by a programmable reflective element.

14. An optronic system comprising an image sensor functioning with a first signal acquisition frequency, each image obtained by the image sensor representing a scene and a movement compensation device, wherein the optronic system comprising a movement detection device according to claim 1 generating signal values representing movements of said scene with a second signal acquisition frequency higher than the first signal acquisition frequency, and a processing device able to control the movement compensation device according to said signal values representing movements.

15. A method for processing high-frequency movements in an optronic system comprising an image sensor functioning with a first signal acquisition frequency, each image obtained by the image sensor representing a scene,
wherein the method comprises:
obtaining signal values representing a movement of said scene from a movement detection device generating signal values representing movements that can affect the acquisition of images by the image sensor with a second signal acquisition frequency, higher than the first signal acquisition frequency,
determining values representing a movement of an image in the course of acquisition by the image sensor from said signal values representing a movement of said scene, said determination comprising a matrix operation between said signal values representing a movement of said scene and a conversion matrix, the conversion matrix being obtained by an obtaining method comprising a simulation of signals representing movements obtained by the movement detection device, the obtaining method taking into account characteristics of the movement detection device, and
transmitting the values representing a movement of the image being acquired by the image sensor that is determined to a movement compensation device so that said movement compensation device can implement a feedback in the optronic system in order to compensate the movement of the image in the course of acquisition by the image sensor.

16. A non-transitory information storage medium storing a computer program containing the instructions for implementing, by a device, the method according to claim 15 when said computer program is executed by a processor of said device.

* * * * *